(12) United States Patent
Bondade et al.

(10) Patent No.: US 10,181,847 B2
(45) Date of Patent: Jan. 15, 2019

(54) RING AMPLITUDE MEASUREMENT AND MITIGATION

(71) Applicant: TEXAS INSTRUMENTS INCORPORATED, Dallas, TX (US)

(72) Inventors: Rajdeep Bondade, Richardson, TX (US); Nathan Schemm, Rowlett, TX (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/636,365

(22) Filed: Jun. 28, 2017

(65) Prior Publication Data

US 2018/0219547 A1    Aug. 2, 2018

Related U.S. Application Data

(60) Provisional application No. 62/453,181, filed on Feb. 1, 2017.

(51) Int. Cl.
| | | |
|---|---|---|
| *H03K 3/00* | (2006.01) | |
| *H03K 17/687* | (2006.01) | |
| *H03K 5/1532* | (2006.01) | |
| *H03K 5/08* | (2006.01) | |
| *H03K 3/0233* | (2006.01) | |
| *H03K 5/24* | (2006.01) | |
| *H02M 1/08* | (2006.01) | |

(52) U.S. Cl.
CPC ............ *H03K 17/687* (2013.01); *H02M 1/08* (2013.01); *H03K 3/02337* (2013.01); *H03K 5/08* (2013.01); *H03K 5/1532* (2013.01); *H03K 5/2472* (2013.01)

(58) Field of Classification Search
None
See application file for complete search history.

(56) References Cited

U.S. PATENT DOCUMENTS

| | | |
|---|---|---|
| 4,857,931 A | 8/1989 | Gulczynski |
| 6,429,638 B1 | 8/2002 | Wight et al. |
| 6,972,611 B1 | 12/2005 | Thalheim |

(Continued)

*Primary Examiner* — Cassandra Cox
(74) *Attorney, Agent, or Firm* — Michael A. Davis, Jr.; Charles A. Brill; Frank D. Cimino

(57) ABSTRACT

An apparatus includes a voltage divider circuit including a plurality of series-connected capacitors and including an input terminal of one of the capacitors configured to receive a first voltage from a switch, and a ring node comprising the connection between at least two of the series-connected capacitors. The apparatus further includes a negative clamp circuit coupled to the ring node of the voltage divider circuit and a bias voltage node. The bias voltage node is configured to receive a bias voltage and responsive to a ring voltage on the ring node being less than the bias voltage, the negative clamp circuit is configured to clamp the ring voltage at a first threshold voltage. The apparatus also includes a peak detector circuit coupled to the ring node of the voltage divider circuit and configured to detect a peak amplitude of the ring voltage. The apparatus further includes a switch driver coupled to the peak detector circuit and configured to adjust a control signal to the switch responsive to the detected peak amplitude.

20 Claims, 5 Drawing Sheets

(56) References Cited

U.S. PATENT DOCUMENTS

| | | |
|---|---|---|
| 2001/0035743 A1 | 11/2001 | Feldtkeller |
| 2008/0106297 A1 | 5/2008 | Jao |
| 2009/0040796 A1 | 2/2009 | Lalithambika et al. |
| 2010/0079186 A1 | 4/2010 | Zannoth et al. |
| 2011/0031949 A1 | 2/2011 | Zhang et al. |
| 2013/0049735 A1* | 2/2013 | Shafer .................... H03F 1/523 324/76.11 |
| 2013/0315294 A1 | 11/2013 | Ishizeki |
| 2015/0061750 A1 | 3/2015 | Kandah et al. |
| 2016/0285366 A1 | 9/2016 | Lee et al. |
| 2017/0012618 A1 | 1/2017 | Krishna |
| 2017/0040894 A1 | 2/2017 | MeVay |
| 2017/0366083 A1* | 12/2017 | Emsenhuber ........... H02M 1/08 |

\* cited by examiner

RING AMPLITUDE MEASUREMENT AND MITIGATION

CROSS-REFERENCE TO RELATED APPLICATIONS

The present application claims priority to U.S. Provisional Patent Application No. 62/453,181, which was filed Feb. 1, 2017, is titled "Technique and Circuits for Vds Ring Amplitude Measurement and Closed-Loop Control," and is hereby incorporated herein by reference in its entirety.

BACKGROUND

Power transistor switches—because of their fast switching speed, their compatibility for parallel operation and their ability to deal with high voltages—are widely used in power electronic applications, such as in motor drivers. Using high frequency switches is advantageous as they permit higher system frequencies and power densities. However, high frequency switching has its negative effects. For example, fast-switching (or high-frequency-switched) field effect transistors (FETs) can experience significant voltage overshoots and ringing on at least one of the terminals (e.g., drain) of the FET. The high frequency switching and high amplitude voltage ringing produces electromagnetic interference which can impact system reliability, increase the system voltage stress and decrease the overall service life.

SUMMARY

According to an embodiment, a closed-loop ring amplitude adjustment circuit includes a voltage divider circuit which further comprises a plurality of series-connected capacitors. In some embodiments, an input terminal of one of the capacitors is configured to receive a first voltage from a switch, and a ring node comprising the connection between at least two of the series-connected capacitors. The closed-loop ring amplitude adjustment circuit further comprises a negative clamp circuit coupled to the ring node of the voltage divider circuit and a bias voltage node. In some embodiments, the bias voltage node is configured to receive a bias voltage and responsive to a ring voltage on the ring node being less than the bias voltage, the negative clamp circuit is configured to clamp the ring voltage at a first threshold voltage. The closed-loop ring amplitude adjustment circuit further includes a peak detector circuit coupled to the ring node of the voltage divider circuit and is configured to detect a peak amplitude of the ring voltage. The closed-loop ring amplitude adjustment circuit further includes a switch driver coupled to the peak detector circuit and in some embodiments, is configured to adjust a control signal to the switch responsive to the detected peak amplitude.

In another embodiment, a ring amplitude adjustment circuit includes a voltage divider circuit including a plurality of series-connected impedances. In some embodiments, the series-connected impedance includes an input terminal of one of the impedances configured to receive a first voltage from a switch and a ring node including the connection between at least two of the series-connected impedances. The ring amplitude adjustment circuit further includes a negative clamp circuit coupled to the ring node of the voltage divider circuit and a bias voltage node. In some embodiments, the negative clamp circuit is configured to clamp a ring voltage of the ring node at a first threshold voltage. The ring amplitude adjustment circuit also includes a peak detector circuit coupled to the ring node of the voltage divider circuit and is configured to detect a peak amplitude of the ring voltage. The ring amplitude adjustment circuit further includes a comparator configured to compare the detected peak amplitude to a reference voltage and to generate a comparator output signal and in some embodiment, the ring amplitude adjustment circuit includes a digital controller coupled to the comparator and, responsive to the comparator output signal, configured to cause a control signal to the switch to be adjusted.

In another embodiment, a method includes receiving, by a voltage divider circuit, a first voltage from a switch. The method can also include, in an embodiment, clamping a ring voltage derived from the first voltage at a first threshold voltage responsive to the ring voltage being less than a bias voltage. Further, the method can include detecting a peak amplitude of the ring voltage and adjusting a control signal to the switch in response to the detected peak amplitude.

BRIEF DESCRIPTION OF THE DRAWINGS

For a detailed description of various examples, reference will now be made to the accompanying drawings in which.

DETAILED DESCRIPTION

The magnitude of a ringing signal is tied to the switching speed of a switch, and also on the amount of stray inductance and/or capacitance in a system. For example, in power electronic applications, a power converter with a half-bridge topology including a high-side switch and a low-side switch can be employed. The half-bridge topology system can have unwanted parasitic elements (e.g., inductance, capacitance) which stores energy during on/off or off/on transition of each of the high-side and the low-side switch. This stored energy is commonly referred to as "di/dt" noise and the di/dt noise subsequently needs to be dissipated. In some embodiments, the di/dt noise dissipates as ringing at the switch transitioning from on/off or off/on state.

At least some of the embodiments disclosed herein are directed to a ring amplitude sensor circuit which is configured to measure a peak AC amplitude of a ringing voltage and, in response to the measured peak AC amplitude, the ring amplitude sensor is configured to adjust a control signal driving a switch. Because the magnitude of the control signal impacts switching speed, and further because switching speed impacts switching loss, EMI noise and ringing, adjusting the control signal can adjust the switching speed of the switch, which, in turn, adjusts (e.g., reduce) the magnitude of the ringing. In some embodiments, as described further below, the magnitude of the ringing can also be adjusted by altering a start time of a ringing mitigation phase when the switch transitions between on/off states.

Figure 1:
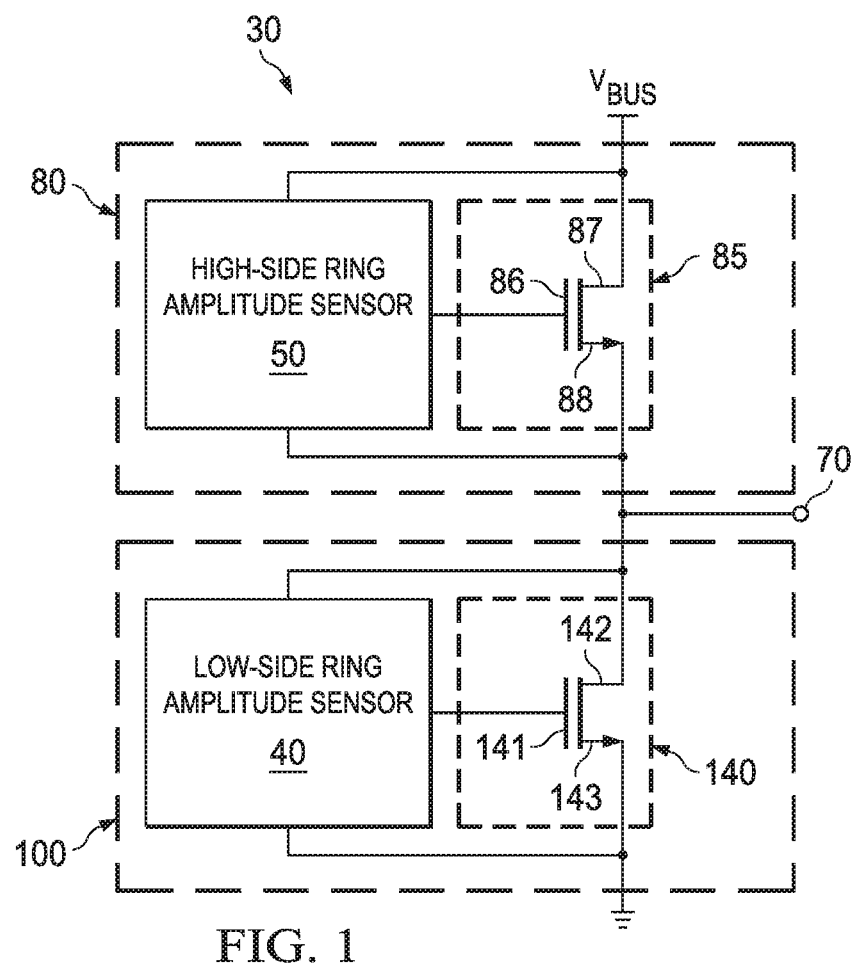
FIG. 1 shows an example circuit system configured to employ a ring amplitude sensor for each switch present in the circuit system, in accordance with various examples.

The example circuit system shown in FIG. 1 is a half-bridge configuration of a converter 30 usable to drive a high powered load connected to a line 70. In some embodiments, the converter 30 adjusts (e.g., reduces or increases) ringing, as described further below, occurring during on/off transition of both high-side switch 85 and low-side switch 140. The example embodiment is directed towards a converter driving a load, but the principles can be applied to other types of converters including transistors and driving any type of load. The converter 30 disclosed in the FIG. 1 can further include a high-side closed loop ring amplitude adjustment circuit 80, which further includes a high-side ring amplitude sensor 50 driving the high-side switch 85. Similarly, the converter 30 can also include a low-side closed loop ring amplitude adjustment circuit 100 further including a low-side ring amplitude sensor 40 driving the low-side switch 140.

In the example of FIG. 1, the switches (low-side and high-side) employed are metal oxide semiconductor field effect transistors (MOSFETS), and the control input is their gate. For instance, the switch 85 comprises a drain 87, a source 88 and a gate 86. In other embodiments the transistors can be bipolar transistors, in which case the control input can be a base. In other embodiments, the switches comprise silicon carbide (SiC) transistors and in other examples, a switch is a device that has properties similar to the properties of a transistor or any other semiconductor switching device.

As discussed above, the example converter shown in FIG. 1 employs a separate ring amplitude adjustment circuit to adjust the corresponding control signal of each switch present in the circuit system. For example, the low-side closed loop ring amplitude adjustment circuit 100 employs the low-side ring amplitude sensor 40 which receives feedback from the low-side switch 140 and asserts a control signal to the low-side switch 140 based on the received feedback. Similarly, in the example of FIG. 1, the high-side closed loop ring amplitude adjustment circuit 80 employs the high-side ring amplitude sensor 50 to receive feedback from the high-side switch 85 and asserts a control signal to the switch 85 based on the received feedback.

Both the high-side ring amplitude sensor 50 and the low-side ring amplitude sensor 40 receive drain and source voltage levels as a feedback from the high side switch 85 and the low-side switch 140 respectively. For example, to drive a high powered load (e.g., industrial motor), the high-side switch 85 is connected to a bus voltage (e.g., 1000 V) and the low-side switch connects to the ground. In a case when the high-side switch 85 turns off and the low-side switch 140 turns on, the drain 142 to source 143 voltage of the low-side switch 140 falls from the bus voltage of 1000 V to ground, causing ringing at the low-side switch 140 and the drain and source voltage levels are sent as a feedback from low-side switch 140 to the low-side ring amplitude sensor 40 to adjust (e.g., reduce) the ringing.

Figure 2:
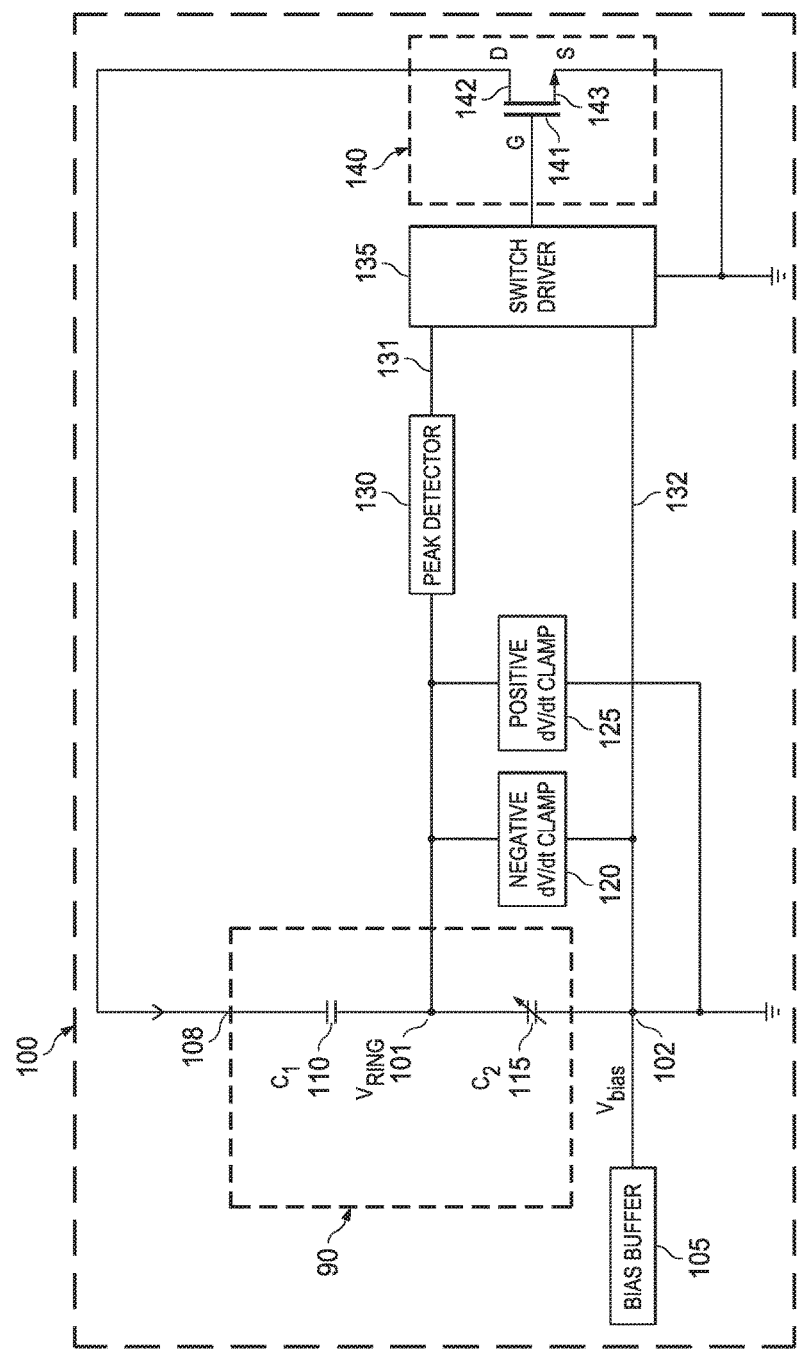
FIG. 2 shows a detailed diagram of an illustrative low-side closed loop ring amplitude adjustment circuit system of FIG. 1, in accordance with various examples.

FIG. 2 further shows an example of a closed-loop ring amplitude adjustment circuit 100 configured to mitigate ringing which occurs in certain circuit configurations. As described for an example of FIG. 1, there can be a transition from a very high voltage of 1000 V to ground when the low-side switch 140 is turned on and this transition isn't instantaneous and occurs with time, such that the slope of voltage and time curve is negative, herein referred as "negative dV/dt transition." The example of FIG. 2 further shows a negative clamp circuit 120 with one terminal connected to the ring node 101 and the other terminal connected to a bias node 102. The bias node 102 receives a bias voltage ($V_{bias}$) 105. During the negative dV/dt transition, due to capacitive coupling with the first capacitor 110, the ring voltage at ring node follows the input voltage received at the terminal 108 and the negative clamp circuit 120 restricts the ring voltage at the ring node 101 from dropping below the first threshold.

In some embodiments, FIG. 2 shows a voltage divider circuit 90 utilized, as further described below, to divide down and capture AC information of the input voltage (received at the input terminal 108) during ringing. In some embodiments, the voltage divider circuit 90 includes a first capacitor 110 connected to a second capacitor 115 in series. In other embodiments, the voltage divider circuit 90 comprises a plurality of resistors connected in series. Ring node 101 is the node between the capacitors 110 and 115. The voltage divider circuit 90 receives an input voltage at an input terminal 108. The input voltage comprises, in this example, the drain voltage of the low-side switch 140.

As described above, during the negative dV/dt transition, the negative clamp circuit 120 clamps the ring voltage at the ring node 101 at the first threshold. The clamping at the ring node 101 lasts until the input voltage received at the terminal 108 increases beyond the first threshold voltage. During this negative dv/dt transition, di/dt noise is accumulated which can be dissipated as ringing and is detected at the ring node 101 as a high oscillation damping signal (ringing). When the negative clamp circuit 120 is turned off, the voltage divider circuit 90 is configured to divide the high oscillation damping signal (ringing). For example, the voltage divider can be configured to divide down just the high oscillation damping signal, thereby improving the overall resolution of the low-side ring amplitude sensor 40.

For instance, assume an example fixed capacitor divider ratio of 0.05. During the negative dV/dt transition, the ring voltage at the ring node 101 is the first threshold voltage. Consequently, during ringing, the voltage divider circuit 90 divides down a peak AC amplitude during ringing, for example, 50V to a voltage of 2.5V, which is a sizable fraction of the actual ringing (50V) occurring at the drain terminal of the low-side switch 140. Therefore, a negative clamp circuit 120 is utilized to clamp the negative dV/dt transition voltage at a first threshold voltage which allows the low-side ring amplitude sensor 40 to employ a voltage divider circuit 90 which don't require dividing down the input voltage received at the node 108 to very low value of e.g., 5V resulting in a substantially low peak AC amplitude during ringing. Therefore, using the negative clamp circuit 120 improves the overall resolution of the amplitude sensor. In some embodiments, the second capacitance 115 can be configurable to produce desired peak AC amplitude of ringing. For example, if a user wants to have peak AC ring amplitude of 20V, or 50V or 100V, the user can change the second capacitance accordingly, without having to modify and/or add any additional circuitry.

FIG. 2 further shows a positive clamp circuit 125 with one terminal connected to the ring node 101 and another terminal connected to ground. When the low-side switch 140 is turned off, the voltage transition occurs from a very high low voltage (e.g., 0 V) to a high voltage (1000 V) and this transition occurs with time, such that the slope of voltage and time curve is positive (positive dV/dt transition). For such a case, the positive clamp circuit 125, as described further below, can be enabled to clamp the ringing voltage received at the ring node 101 at a second threshold voltage.

FIG. 2 further includes a peak detector 130 coupled to the ring node 101. Ringing occurs as energy stored in parasitic inductances dissipates, causing the ring voltage at the drain of low-side switch 140 and thus at ring node 101 to produce a damping high oscillation signal. As described further below, the peak detector 130 outputs a DC voltage capturing peak AC amplitude during this damping high oscillation period. The peak detector 130 further couples to a switch driver 135 through a connection wire 131 and the switch driver 135 is configured to adjust a control signal asserted to the gate 141 of low-side switch 140. Adjusting the control signal causes the switching speed of the low-side switch 140 to be adjusted to thereby further adjust (e.g., reduce) the peak AC amplitude detected by the peak detector 130. In some embodiments, adjusting the timing of gate drive strength of the low-side switch 140 adjusts the peak AC amplitude detected by the peak detector 130.

Figure 3:
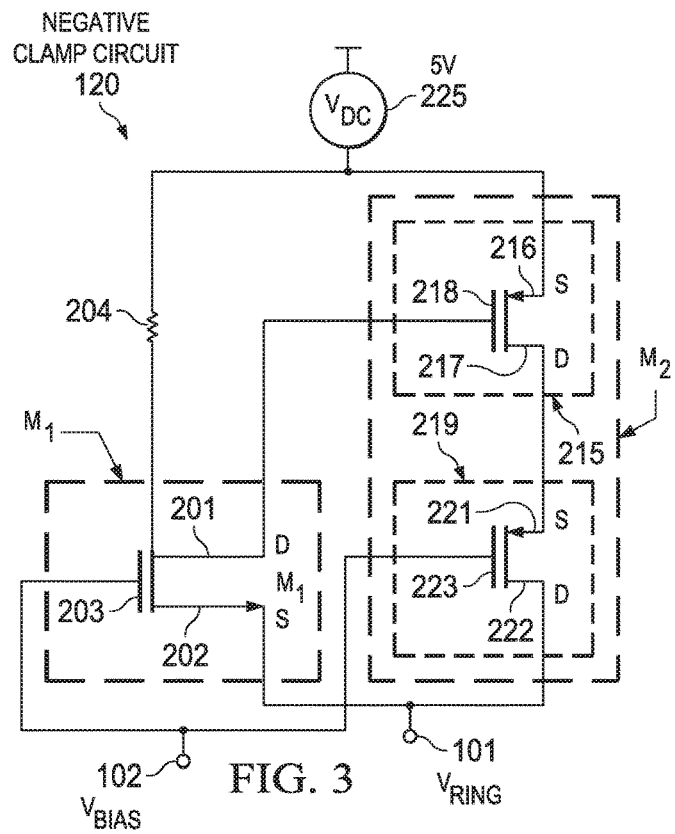
FIG. 3 shows a detailed diagram of an illustrative negative clamp circuit of FIG. 2, in accordance with various examples.

FIG. 3 shows a detailed example of the negative clamp circuit 120. As described above, the negative clamp circuit 120 restricts the voltage at the ring node 101 from dropping below the first threshold voltage. The illustrative negative clamp circuit 120 of FIG. 2 includes switches M1 and M2. Switch M1 can be an n-type MOSFET with a threshold voltage $(V_{TH})_{M1}$. The switch M2 includes a first p-type MOSFET 215 and a second p-type MOSFET 220, with a drain terminal 217 of the MOSFET 215 coupled to a source terminal 221 of MOSFET 220. A gate terminal 218 of MOSFET 215 can be connected to a drain terminal 201 of the switch M1. A gate terminal 203 of the switch M1 and the gate terminal 223 of MOSFET 220 are coupled together and to the bias node 102. A source terminal 202 of the switch M1 connects to a drain terminal 222 of MOSFET 220 at the ring node 101. The drain terminal 201 of the switch M1 connects through resistor 204 to an external DC voltage 225 to source extra current during clamping. Similarly, a source terminal 216 of MOSFET 215 is also connected to the external DC voltage 225 to source extra current.

During the negative dV/dt transition, due to capacitive coupling with the first capacitor 110, the magnitude of the ring voltage at the ring node 101 also starts to drop. However, when the ring voltage at the ring node 101 falls below the threshold voltage $(V_{TH})_{M1}$, switch M1 turns ON and a first current path forms between the external DC voltage 225 to the ring node 101 in order to maintain a ring voltage level at the ring node 101 at the first threshold value of $V_{bias}-(V_{TH})_{M1}$. The current flow between the external DC voltage 225 and the ring node 101 causes a potential drop across a resistor 204, which in turn causes the switch M2 to also turn ON and form additional current path to assist in clamping the voltage at the ring node 101. The clamping at the ring node 101 will last until the input voltage received at the terminal 108 (FIG. 2) increases beyond the first threshold voltage.

The input voltage received at the terminal 108 stops dropping and begins to increase. Due to capacitive coupling, the increase in the input voltage received at the terminal 108 increases the voltage on the ring node 101. As the ring voltage at the ring node 101 goes above the bias voltage $V_{bias}$, the switch M1 automatically turns OFF as a voltage between the gate terminal 203 and source terminal 202 goes below the threshold value. In an embodiment, this turns OFF the negative clamp circuit 120 while the peak detector 130 captures peak AC amplitude of the ring voltage present at the ring node 101.

Figure 4:
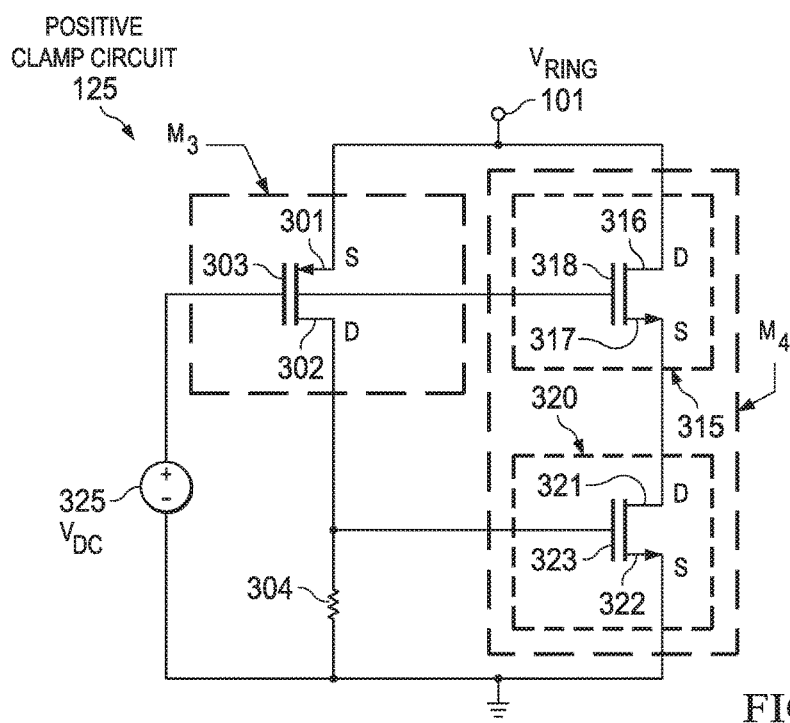
FIG. 4 shows a detailed diagram of an illustrative positive clamp circuit of FIG. 2, in accordance with various examples.

FIG. 4 shows a detailed diagram of an example positive clamp circuit 125. As described for an example system in FIG. 2, the positive clamp circuit 125 can clamp ringing voltage received at the ring node 101 at a second threshold voltage. In an embodiment, the positive clamp circuit 125 can further include a switch M3, such as a p-type MOSFET with a threshold voltage $(V_{TH})_{M3}$. The positive clamp circuit 125 can further include an additional switch M4. The switch M4 composes of a first n-type MOSFET 315 and a second n-type MOSFET 320, with a source terminal 317 of the MOSFET 315 coupled to a drain terminal 321 of the MOSFET 320.

In an embodiment, a source terminal 301 of the switch M3 is connected to the ring node 101 and a drain terminal 316 of the switch 315. A gate terminal 303 of the switch M3 is connected to a positive terminal of a DC voltage source 325 and a negative terminal of the DC voltage source 325 is further connected to a source terminal of the switch 320. A drain terminal 302 of the switch M3 is connected to the gate terminal 323 of the switch 320 and is further connected to the source terminal 322 through a resistor 304. The negative terminal of the DC voltage source 325, the resistor 304 coupled to the drain terminal 302 and the source terminal 322 further couples to a ground. Source terminal 317 of the switch 315 connects to the drain terminal of the switch 320 and the gate terminal 318 of the switch 315 is connected to the gate terminal 303 of the switch M3.

The positive clamp circuit 125 turns on during the positive dV/dt transition, i.e., when the voltage between the gate terminal 303 and the source terminal 301 goes above the threshold voltage $(V_{TH})_{M3}$. This results in forming a first current sinking path from the ring node 101 to the ground, maintaining the voltage at the ring node 101 at a second threshold. The first current sinking path further causes a potential drop at the resistor 304 which can turn on the switch M4, further forming a second current sinking path from the ring node 101 to the ground.

Figure 5:
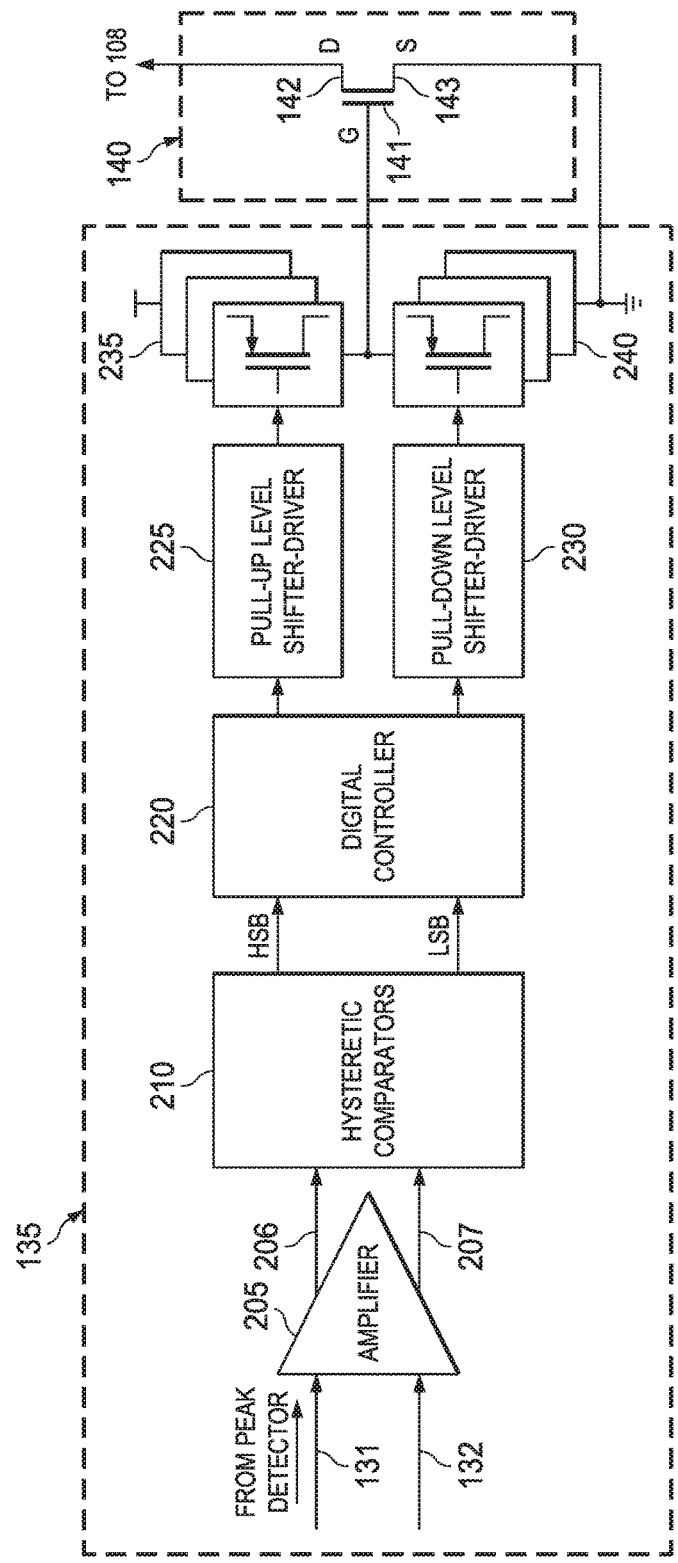
FIG. 5 shows a detailed diagram of an illustrative switch driver of FIG. 2, in accordance with various examples.

FIG. 5 shows a detailed diagram of an illustrative switch driver 135 of FIG. 2. In this embodiment, the switch driver 135 comprises an amplifier 205, a hysteretic comparators 210 coupled to the amplifier 205, and a digital controller 220 coupled to the hysteretic comparators 210. The switch driver 135 further comprises a pull-up level shifter-driver 225 driving high-side segmented switches 235 and a pull-down level shifter-driver 230 driving low-side segmented switches 240. The pull-up level shifter-driver 225 and the pull-down level shifter-driver 230 are coupled to the digital controller 220.

The amplifier 205 receives the peak AC amplitude of the ring voltage as captured by the peak detector 130. In an embodiment, the amplifier 205 can be a differential input-differential output sample and hold amplifier which can amplify the peak amplitude of the ring voltage with reference to a reference voltage. For example, the amplifier 205 receives two inputs via connections 131, 132 and provides outputs through two connections 206, 207. Connection 131 receives the peak amplitude of the ring voltage captured by the peak detector 130 and the connection 132 receives a reference voltage such as, the bias voltage received at the bias node 102. A first output voltage and a second output voltage, proportional to the peak AC amplitude detected by the peak detector 130, are generated at connection 206 and connection 207, respectively.

In some embodiments, the output signals from the connections 206, 207 of the amplifier 205 are provided to the hysteretic comparator 210. The hysteretic comparator 210 is configured to generate two output bits, herein referred as HB and LB to indicate whether the captured peak ring amplitude is high or low (e.g., positive or negative). In response to output bits HB and LB, the digital controller 220 determines the adjustment to be made to the control signal. The digital controller 220, further, adjusts the control signal by activating a specific number of high-side segmented switches 235 and low-side segmented switches 240. For example, in a case when the output of the hysteretic controller 210 indicates that the captured ring is high, the digital controller 220 adjusts (e.g., reduce) the amount of control signal received by the low-side switch 140. In this example, the amount of the control signal can be adjusted by reducing the number of high-side segmented switches 235 turned on to charge the gate terminal 141 of the low-side switch 140. The higher the number of high-side segmented switches 235 that are turned on, the higher is the current of the control signal to the gate terminal 141 and the faster the low-side switch 140 turns on. Conversely, reducing the number of high-side segmented switches 235 that are turned on results in the low-side switch 140 turning on more slowly.

As discussed above in FIG. 1, there can be a transition from a very high voltage of 1000 V to ground when the low-side switch 140 is turned on and this transition isn't instantaneous and occurs with time. In some embodiments, the turn on time of the low-side switch 140 can be divided into three phases—negative dV/dt transition time T1 as phase 1, ring mitigation time T2 as phase 2 and complete turn on time T3 as phase 3. For example, the time T1 can be defined as the time taken by the low-side switch 140 during negative dV/dt transition. The time T2 can be the time during which high oscillation signal (ringing) is damped and the time T3 can be time when the low-side switch 140 is driven to be completely turned on.

In some embodiments, the digital controller 220 can further adjust the control signal by activating a specific number of high-side segmented switches 235, so as to adjust the start of time T2, of phase 2—resulting in an adjusted (e.g., reduced) peak AC ring amplitude. For example, assume the low-side switch 140 takes 20 ns to complete the negative dV/dt phase (transition time T1), from time 0, while the ringing mitigation phase lasts for 30 ns, leading to 50V in peak AC ring amplitude, as a consequence of the system parasitic. To reduce the amplitude of the ring, the digital controller 220 can be configured to start phase 2 even before the negative dV/dt phase has completed, thereby effectively reducing the time T1, while keeping T2 constant. This consequently results in smaller peak AC ring amplitude.

Figure 6:
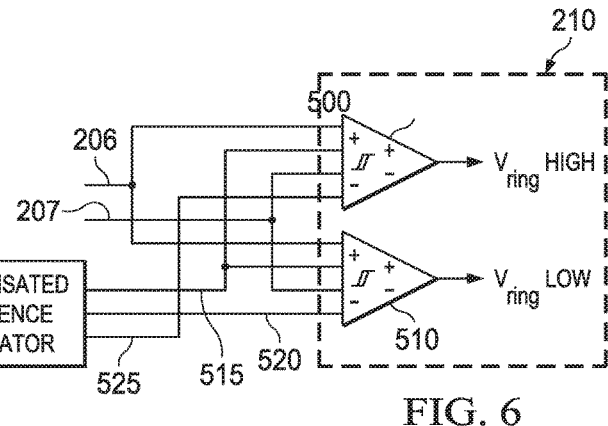
FIG. 6 shows a detailed diagram of illustrative hysteretic comparators, in accordance with various examples.

FIG. 6 shows a detailed diagram of the hysteretic comparator 210, in accordance with various embodiments. In some embodiments, the hysteretic comparator 210 includes a reference generator 530, a high side comparator 500 generating the "HB" bit and a low side comparator 510 generating the "LB" bit. The high side comparator 500 generates HB by comparing input voltages with reference values. For example, the high side comparator 500 can subtract a first amplifier output received through the terminal 206 to a positive reference voltage to form a first input and subtract a second amplifier output received through the terminal 207 to a negative high side reference value to form a second input. The high side comparator further compares the added value of the first input and the second input with a present reference value (e.g., 0). If the added value is positive, i.e., above 0, the HB will be 1, referring a "too high" peak AC amplitude.

Similarly, the low side comparator 510 generates the LB by comparing input voltages with reference values. For example, the low side comparator 500 subtracts a first amplifier output received through the terminal 206 to a positive reference voltage and subtracts a second amplifier output received through the terminal 207 to a negative low side reference value to produce a first and a second input. Further, the low side comparator further adds the first and the second input and compare the added value with the present reference value (e.g., 0). If the added value is negative, i.e., below 0, the LB will be 1, referring a "too low" peak AC amplitude.

Figure 7:
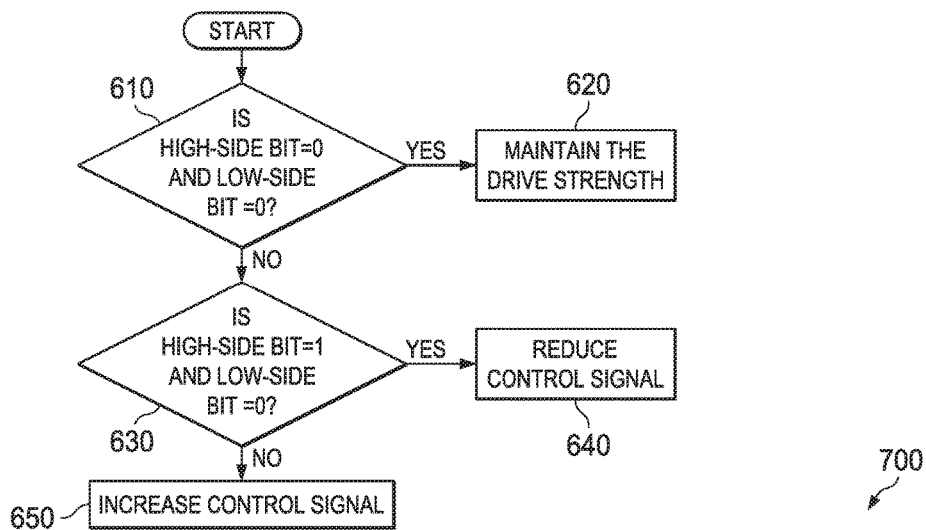
FIG. 7 shows an example flow diagram of adjusting a control signal by the digital controller, in accordance with various examples.

FIG. 7 is an example flow diagram of adjusting a control signal by the digital controller 220 in response to HB and LB generated by the hysteretic comparator 210. The flow diagram starts with a block 610 by checking if both HB and LB are low, i.e., 0. For example, the digital controller 220 receives the HB and LB. If the received bits are low, the flow diagram proceeds to a block 620 and maintains the control signal driving the low-side switch 140. However, if either of the HB or LB is high (i.e., 1), then control flows to 630 and a determination is made by the digital controller 220 as to whether the HB is high and LB is low. If that is the case, then at 640, the digital controller 220 reduces the control signal (e.g., by reducing the number of activated high side segmented switches 235). Otherwise, the HB is low and the LB is high and the digital controller responds at 650 by increasing the control signal (e.g., by increasing the number of activated high side segmented switches 235).

Figure 8:
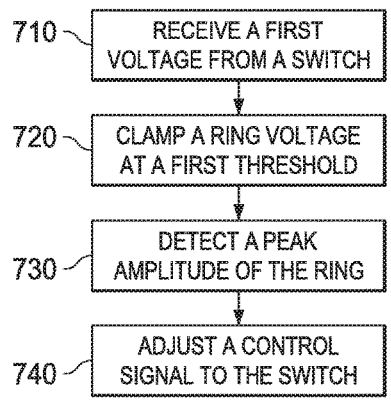
FIG. 8 shows an illustrative flow diagram illustrating aspects of operations that can be performed to reduce peak AC amplitude during ringing, in accordance with various examples.

FIG. 8 shows a flow diagram illustrating aspects of operations that can be performed to reduce peak AC amplitude during ringing. Though depicted sequentially as a matter of convenience, at least some of the actions shown can be performed in a different order and/or performed in parallel. Additionally, some embodiments can perform only some of the actions shown. In some embodiments, at least some of the operations of the method 700 can be performed by the closed-loop ring amplitude sensor system described in the FIG. 2 and therefore the operations described in method 700 are now described with reference to FIG. 2.

The method 700 starts in block 710 with receiving a first voltage from a switch. For example, voltage divider circuit 90 receives an input voltage (drain to source voltage of the low-side switch 140) from the low-side switch 140. The method 700 continues in block 720 with clamping a ring voltage at a first threshold. Due to capacitive coupling, the ring voltage follows the input voltage received at the input terminal 108 and in a case when the ring voltage falls below a first threshold value, the negative clamp circuit 120 clamps the ring voltage at the first threshold value.

The method 700 continues at block 730 with detecting a peak AC amplitude of the ringing voltage. For example, as described above, ringing occurs as energy stored in parasitic inductances dissipates, thereby causing the ring voltage at the ring node 101 to generate a damping high oscillation signal and these oscillations can have a peak AC amplitude and the block 730 detects the peak AC amplitude. The method 700 further continues at block 740 with adjusting a control signal to the low-side switch 140. For example, depending on the peak AC amplitude detected in the block 730, the switch driver 135 adjusts a control signal asserted to the low-side switch 140. Adjusting the control signal adjusts switching speed of the low-side switch 140 and, in consequence of that, can further adjust the peak AC amplitude detected by the peak detector 130.

Certain terms are used throughout the following description and claims to refer to particular system components. Different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A closed-loop ring amplitude adjustment circuit, comprising:
   a voltage divider circuit comprising a plurality of series-connected capacitors and including an input terminal of one of the capacitors configured to receive a first voltage from a switch, and a ring node comprising the connection between at least two of the series-connected capacitors;
   a negative clamp circuit coupled to the ring node of the voltage divider circuit and a bias voltage node, wherein the bias voltage node is configured to receive a bias voltage, wherein, responsive to a ring voltage on the ring node being less than the bias voltage, the negative clamp circuit is configured to clamp the ring voltage at a first threshold voltage;
   a peak detector circuit coupled to the ring node of the voltage divider circuit and configured to detect a peak amplitude of the ring voltage; and
   a switch driver coupled to the peak detector circuit and configured to adjust a control signal to the switch responsive to the detected peak amplitude.

2. The ring amplitude adjustment circuit of claim 1, further comprising a positive clamp circuit coupled to the ring node of the voltage divider circuit and configured to clamp the ring voltage at a second threshold voltage responsive to the ring voltage being greater than the second threshold voltage.

3. The ring amplitude adjustment circuit of claim 2, wherein the positive clamp circuit comprises:
   a first switch configurable, responsive to the ring voltage being greater than the second threshold voltage, to form a first current sink path for a first sink current between the ring node and a ground; and
   a second switch configurable, responsive to the first sink current, to form a second current path for a second sink current between the ring node and the ground.

4. The ring amplitude adjustment circuit of claim 1, wherein the switch driver includes:
   an amplifier coupled to the peak detector, wherein, responsive to the detected peak amplitude of the ring voltage, the amplifier is configured to output a first amplifier output signal and a second amplifier output signal;
   a comparator coupled to the amplifier and configured to compare the first amplifier output signal and the second amplifier output signal with a reference voltage and to generate a comparator output signal; and
   a digital controller coupled to the comparator and wherein, responsive to the comparator output signal, the digital controller is configured to adjust a current flowing in a high side switch and a low side switch, wherein an output terminal of the high side and the low side switch is coupled to the switch.

5. The ring amplitude adjustment circuit of claim 4, wherein the comparator includes:
   a high side comparator configured to compare the first amplifier output to a positive reference value and to compare the second amplifier output to a negative high side reference value to produce a first comparator output signal; and
   a low side comparator configured to compare the first amplifier output to the positive reference value and to compare the second amplifier output to a negative low side reference value to produce a second comparator output signal, wherein the comparator output signal comprises the first comparator output signal and the second comparator output signal.

6. The ring amplitude adjustment circuit of claim 1, wherein the negative clamp circuit comprises:
   a first switch configurable, responsive to the ring voltage being less than the bias voltage, to form a first current path for a first clamp current between a first voltage source and the ring node; and
   a second switch configurable, responsive to the first clamp current, to form a second current path for a second clamp current between the first voltage source and the ring node.

7. The ring amplitude adjustment circuit of claim 1, wherein the switch driver is further configured to adjust a time value in a total time taken by the switch to transition from a first state to a second state.

8. The ring amplitude adjustment circuit of claim 1, wherein at least one of the series-connected capacitors is configurable.

9. A ring amplitude adjustment circuit, comprising:
   a voltage divider circuit including a plurality of series-connected impedances and including an input terminal of one of the impedances configured to receive a first voltage from a switch and a ring node comprising the connection between at least two of the series-connected impedances;
   a negative clamp circuit coupled to the ring node of the voltage divider circuit and a bias voltage node, the negative clamp circuit is configured to clamp a ring voltage of the ring node at a first threshold voltage;
   a peak detector circuit coupled to the ring node of the voltage divider circuit and configured to detect a peak amplitude of the ring voltage;
   a comparator configured to compare the detected peak amplitude to a reference voltage and to generate a comparator output signal; and
   a digital controller coupled to the comparator and, responsive to the comparator output signal, configured to cause a control signal to the switch to be adjusted.

10. The ring amplitude adjustment circuit of claim 9, further comprising a positive clamp circuit coupled to the ring node of the voltage divider circuit and configured to clamp the ring voltage at a second threshold voltage.

11. The ring amplitude adjustment circuit of claim 9 further comprising:

an amplifier coupled to the peak detector, wherein responsive to the detected peak amplitude of the ring voltage, the amplifier is configured to output a first amplifier output and a second amplifier output; and a comparator configured to:
compare the first amplifier output to a positive reference value and to compare the second amplifier output to a negative high side reference value; and
compare the first amplifier output to the positive reference value and to compare the second amplifier output to a negative low side reference value.

12. The ring amplitude adjustment circuit of claim 9, wherein the negative clamp circuit comprises a switch configurable, responsive to the ring voltage being less than the bias voltage, to form a current path for a first clamp current between a first voltage source and the ring node.

13. The ring amplitude adjustment circuit of claim 12, wherein the first threshold voltage is based on the bias voltage and a threshold voltage of the first switch.

14. The ring amplitude adjustment circuit of claim 9, wherein the positive clamp circuit comprises:
a first switch configurable, responsive to the ring voltage being greater than the second threshold voltage, to form a first current sink path for a first sink current between the ring node and a ground; and
a second switch, switch configurable, responsive to the first sink current, to form a second current path for a second sink current between the ring node and the ground.

15. The ring amplitude adjustment circuit of claim 9, wherein at least one of the series-connected impedances is configurable to attain a desired peak amplitude.

16. A method, comprising:
receiving, by a voltage divider circuit, a first voltage from a switch;
clamping a ring voltage derived from the first voltage at a first threshold voltage responsive to the ring voltage being less than a bias voltage;
detecting a peak amplitude of the ring voltage; and
adjusting a control signal to the switch in response to the detected peak amplitude.

17. The method of claim 16 further comprising clamping the ring voltage at a second threshold voltage.

18. The method of claim 16 further comprising:
amplifying the detected peak voltage to generate a first amplifier output and a second amplifier output; and
comparing the first amplifier output and the second amplifier output with a reference voltage and generating a comparator output signal.

19. The method of claim 16, further comprising:
forming a first current path for a first clamp current between a first voltage source and a ring node responsive to the ring voltage being less than a bias voltage; and
in response to the first clamp current, forming a second current path for a second clamp current.

20. The method of claim 16, further comprising:
forming a first current sink path for a first sink current between a ring node and a ground; and
in response to the first sink current, forming a second current sink path for a second sink current between the ring node and the ground.

* * * * *